United States Patent [19]

Kokado

[11] 3,896,387

[45] July 22, 1975

[54] FRACTIONAL FREQUENCY DIVIDERS

[75] Inventor: Naoyuki Kokado, Tokyo, Japan

[73] Assignee: Tokyo Shibaura Electric Company Ltd., Kawasaki, Japan

[22] Filed: May 8, 1974

[21] Appl. No.: 467,855

[30] Foreign Application Priority Data

June 19, 1973 Japan ............................... 48-68288

[52] U.S. Cl. ........... 328/39; 307/220 R; 307/225 R; 328/41; 328/49

[51] Int. Cl. ............................................ H03k 21/00

[58] Field of Search ................... 328/39, 41, 48, 49; 307/220 R, 225 R; 235/150.3, 196

[56] References Cited

UNITED STATES PATENTS 3,446,947 5/1969 Overstreet, Jr. .................. 328/39 X 3,818,354 6/1974 Tomisawa et al. .................... 328/41

*Primary Examiner*—Siegfried H. Grimm
*Attorney, Agent, or Firm*—Oblon, Fisher, Spivak, McClelland & Maier

[57] ABSTRACT

A frequency divider for dividing a frequency in the ratio or fraction whose numerator is 2 and whose denominator is an odd number which comprises a counter circuit for counting input clock pulses; a device connected to the output terminal of the counter circuit so as to deliver a reset signal to the counter circuit when it counts a prescribed number of clock pulses; and a device for supplying a polarity-reversed clock pulse to the counter circuit upon receipt of the reset signal.

22 Claims, 15 Drawing Figures

FRACTIONAL FREQUENCY DIVIDERS

This invention relates to improvements on a frequency divider and more particularly to a frequency divider adapted for a color television camera or color television receiver.

The prior art frequency divider has only been applicable to the case where the divided frequency of an output to that of an input bears to that of an input the ratio or fraction whose numerator is 1 and whose denominator is an integer. However, a frequency divider is often found very useful if it can divide a frequency not only in the ratio or fraction whose numerator is 1 and whose denominator is an integer, but also in the ratio or fraction whose numerator is 2 and whose denominator is an odd number.

With respect to, for example, a color television camera or color television receiver, the 3.85 MHz frequency of a chroma subcarrier is obtained by a high precision crystal oscillator. And the horizontal scanning frequency of 15.75 KHz and the vertical scanning frequency of 60 Hz are provided by separate oscillators each consisting of, for example, an inductor and capacitor. However, an oscillator formed of an inductor and capacitor has low precision and gives rise to prominent variation in its oscillation frequency, resulting in low stability and readiness to be affected by disturbances in synchronizing signals. All these defects eventually lead to the sway or displacement of an image appearing on the screen of a color television receiver. To eliminate such drawbacks, therefore, it is preferred to divide the chroma subcarrier frequency of a high precision crystal oscillator into horizontal and vertical components by a frequency divider.

However, the ratio which the horizontal scanning frequency bears to the chroma subcarrier frequency is 1/227.5, and the ratio which the vertical scanning frequency bears to the horizontal scanning frequency is 1/262.5. The denominators of these fractions are not integral numbers. When both numerators and denominators are multiplied equally by 2, then there are obtained fractions or ratios whose numerators are 2 alike and whose denominators are odd numbers. It has been impossible to carry out such frequency division by the prior art frequency divider. Therefore, the conventional practice of obtaining the horizontal and vertical scanning frequencies by dividing a frequency derived from, for example, the high precision crystal oscillator has been first to quadruple the frequency fsc of 3.58 MHz of the chroma subcarrier, namely, to provide an input signal of 14 MHz, and then divide the frequency of said input signal into a horizontal scanning frequency fh expressed by the following equation:

$$14\text{ MHz} \times 1/455 = 31.5\text{ KHz} = 2fh$$

$$fh = 31.5\text{ KHz} \times \tfrac{1}{2} = 15.75\text{ KHz}$$

and a vertical scanning freqency fv expressed by the following equation:

$$fv = 2fh \times 1/525 = 31.5 \times 1/525 = 60\text{ Hz}$$

Namely, where the frequency f of an input signal is divided in the ratio or fraction whose numerator is 2 and whose denominator is an odd number, the customary practice has been to use a pulse generator giving forth a frequency twice as high as said frequency $f$, namely a frequency $2f$ and dividing said $2f$ frequency in the ratio or fraction whose numerator is 1 and whose denominator is an odd number, as indicated by the following equation:

$$2f \times 1/n = 2/n \cdot f$$

where:

$f$ = frequency of input signal $n$ = odd number

However, the above-mentioned frequency dividing process requires the application of an oscillator capable of developing as high a frequency as 14 MHz in place of the customarily used 3.58 MHz oscillator, leading to the more numerous stages and more complicated arrangement of a frequency divider provided for the ordinary color television camera or color television receiving set.

As apparent from the foregoing description, demand has been made to develop a frequency divider which is capable of dividing the frequency *fsc* of the chroma subcarrier into a horizontal scanning frequency *fh* and a vertical scanning frequency *fv* in the ratio or fraction whose numerator is 2 and whose denominator is an odd number.

It is accordingly an object of this invention to provide a frequency divider capable of carrying out frequency division in the ratio or fraction whose numerator is 2 and whose denominator is an odd number in the case where an output frequency does not bear to an input frequency the ratio or fraction whose numerator is 1 and whose denominator is an integral number.

Another object of the invention is to provide a frequency divider capable of obtaining by simpler arrangement than in the prior art, if particularly required, an output frequency which bears the ratio of $2/(2^{N+1} - 1)$ (where $n$ is an integer) to an input frequency as the result of dividing said input frequency.

The above-mentioned objects are attained by providing a counter circuit for counting input clock pulses, resetting the counter circuit by a reset pulse delivered from a reset pulse supply means connected to the counter circuit when said counter circuit counts a prescribed number of input clock pulses and repeating the counting of input clock pulses after reversing their polarity each time.

The frequency divider of this invention comprises a counter circuit formed of one or more cascade connected binary counter circuit units such as flip-flop circuits so as to count input clock pulses; a reset supply means connected to said counter circuit so as to deliver a reset pulse to the counter circuit when it counts a prescribed number of input clock pulses; and a polarity-reversing device connected to the output terminal of the reset pulse supply means so as to reverse the polarity of input clock pulses supplied to the counter circuit upon receipt of a reset pulse from the reset pulse supply means.

It is further possible as a modification of the aforesaid frequency divider of the first embodiment to supply an output pulse from the counter circuit to the device for reversing the polarity of input clock pulses in a prescribed timing without providing the above-mentioned reset pulse supply means, thereby obtaining an output frequency which bears the ratio of $2/(2^{n+1} - 1)$ (where $n$ is an integer) to an input frequency as the result of dividing said input frequency.

This invention can be more fully understood from the following detailed description when taken in conjunction with the accompanying drawings, in which.

Figure 6:
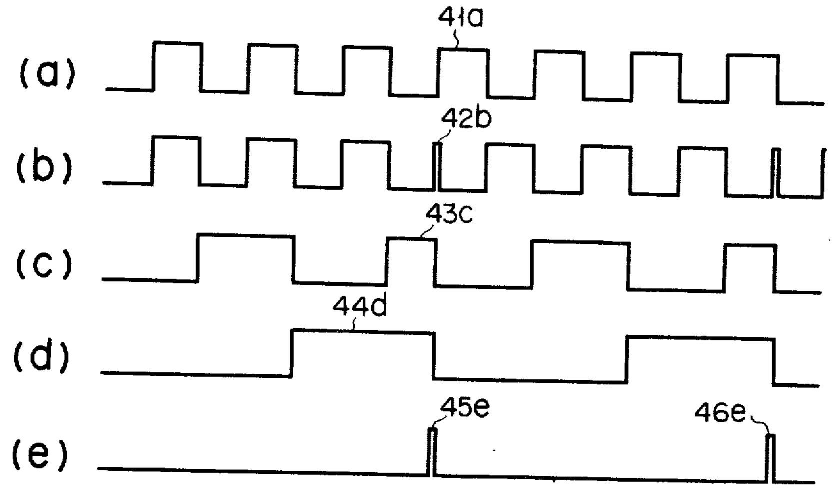
Figure 5:
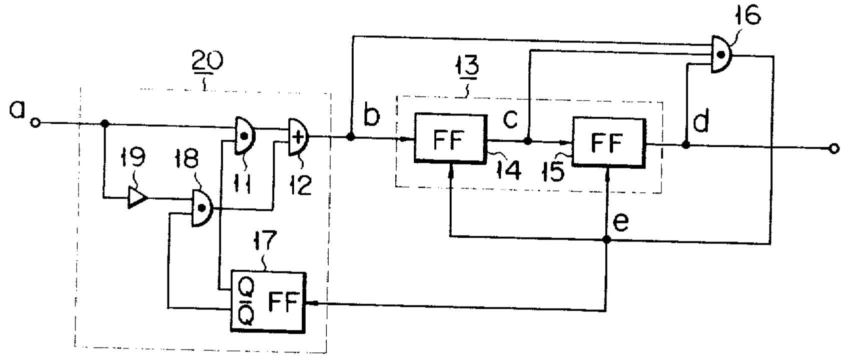
FIG. 5 is a block circuit diagram of a second embodiment of this invention for dividing frequency in the ratio or fraction of 2/7.
Figure 7:
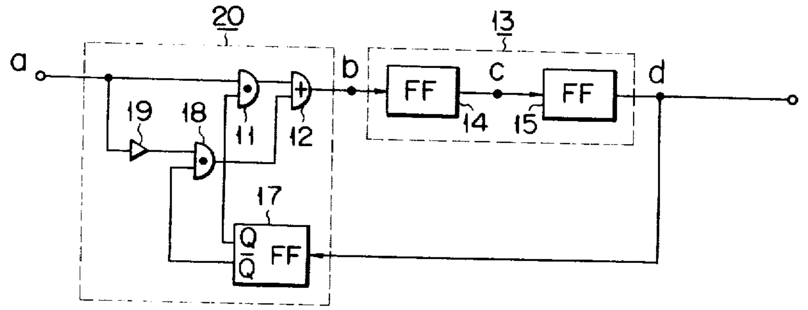
Figure 8:
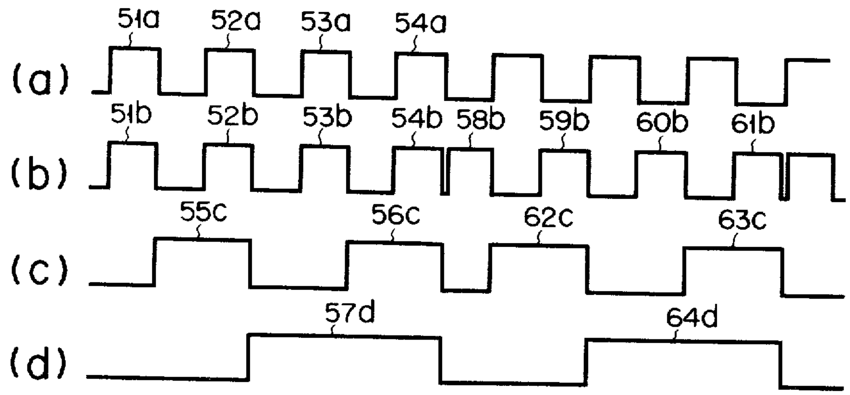
Figure 9A:
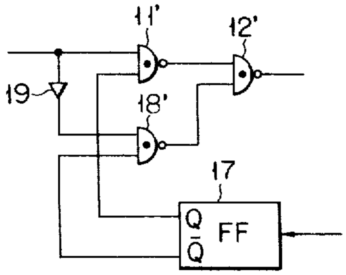
Figure 9B:
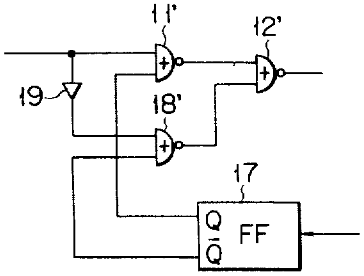
Figure 9C:
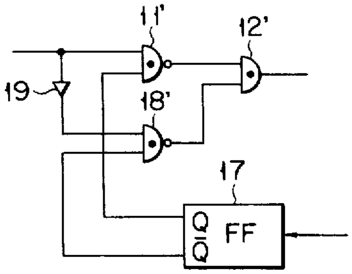
Figure 9D:
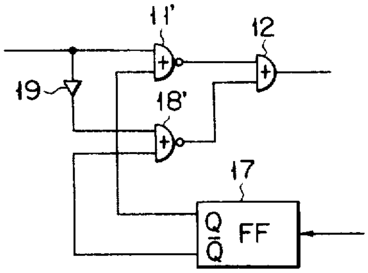
Figure 10A:
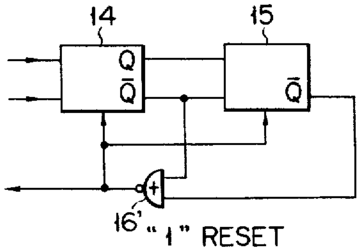
Figure 10B:
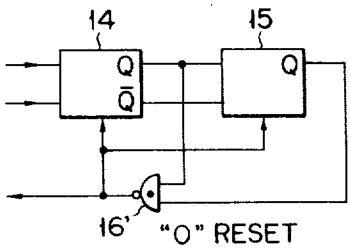
Figure 10C:
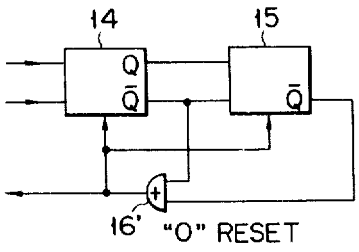

FIG. 6 indicates the wave forms of signals appearing in the various sections of the block circuit diagram of FIG. 5;

FIG. 7 presents a block circuit diagram of a third embodiment of the invention for dividing frequency in the ratio of fraction of $2/(2^{n+1}-1)$ (where $n$ is an integer);

FIG. 8 sets forth the wave forms of signals appearing in the various sections of the block circuit diagram of FIG. 7;

FIGS. 9A to 9D are block circuit diagrams of various modifications of the polarity-reversing device; and FIGS. 10A to 10C are block circuit diagrams of various modifications of the counter-resetting system.

There will now be described with reference to the appended drawings the preferred embodiments of this invention in comparison with the prior art frequency divider.

Figure 1:
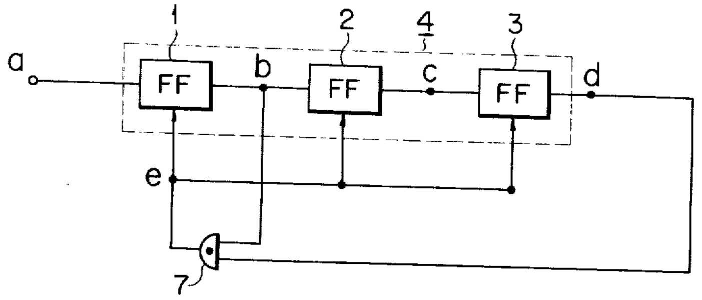
FIG. 1 PRIOR ART
FIG. 1 is a block circuit diagram of the prior art process of dividing frequency in the ratio or fraction whose numerator is 2 and whose denominator is an odd number, more particularly in the ratio or fraction whose numerator is 2 and whose denominator is 5.
Figure 2:
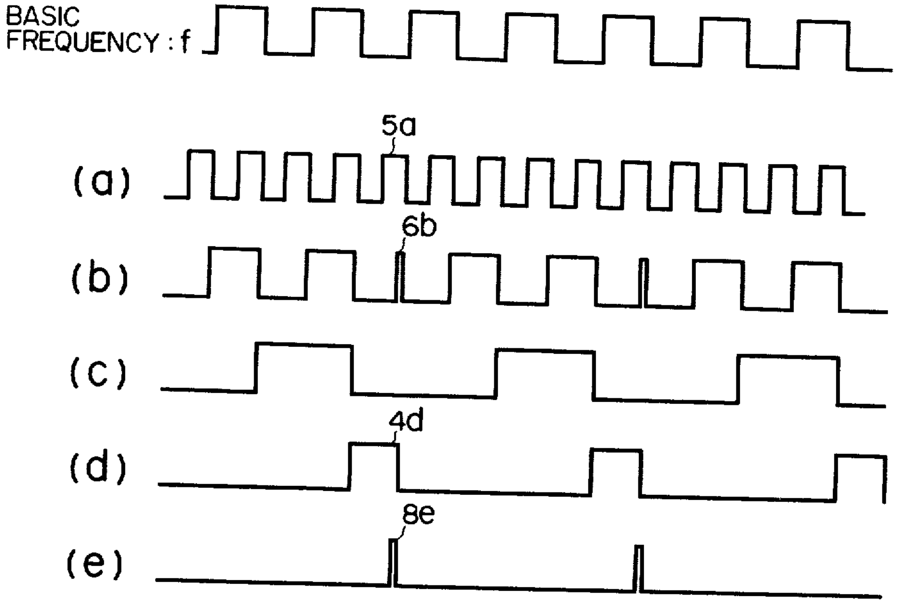
FIG. 2 PRIOR ART
FIG. 2 shows the wave forms of signals appearing in the various sections of the block circuit diagram of FIG. 1.

Referring to FIGS. 1 and 2 representing the prior art, the three cascade connected flip-flop circuits 1, 2, 3 (hereinafter referred to as "FF circuits") jointly constitute a binary counter circuit 4, whose input terminal a is supplied with an input clock pulse having a frequency $2f$ shown in FIG. 2(*a*). The input clock pulse has its frequency divided into halves by the first stage FF circuit to have a wave form indicated in FIG. 2(*b*).

A logical level can generally be so determined as to cause an output pulse from the flip-flop circuit to rise or decay either at the rising or decaying of an input signal. Throughout the preferred embodiments of this invention, it should be understood that a logical level is so determined as to cause an output pulse from the flip-flop circuit to rise or decay at the rising of an input signal.

An output b from the first stage FF circuit 1 has its frequency further divided into halves by the second stage FF circuit 2, producing a pulse having such a wave form as shown in FIG. 2(*c*) at the output terminal c of said second stage FF circuit 2. The decaying of the pulse of FIG. 2(*c*) sets the third stage FF circuit 3. As the result, the level of a pulse from the output terminal d of said third FF circuit 3 rises higher than a 0 level as shown in 4*d* of FIG. 2(*d*). Where, under this condition, the input terminal a is supplied with a fifth clock pulse 5*a*, then an output from the first stage FF circuit 1 rises as shown by a pulse 6*b* of FIG. 2(*b*). As the result, an AND circuit 7 of FIG. 1 is enabled to produce a pulse shown by *8e* of FIG. 2(*e*) on the output terminal *e*. This pulse *8e* is supplied to the FF circuits 1, 2, 3 as a reset signal to clear the contents of the counter circuit 4. Accordingly, an output pulse 4*d* of FIG. 2(*d*) obtained at the output terminal *d* decays in synchronization with the reset pulse 8*e*. Each output pulse 4*d* is given forth for every five clock pulses having a frequency $2f$ shown in FIG. 2(*a*), thereby forming a circuit for effecting a one-fifth frequency division. Therefore the output pulse 4*d* has a frequency equal to two-fifths of a frequency $f$.

Comparison of the wave form of a pulse having the basic frequency f equal to half the frequency of an input clock pulse supplied to the input terminal a with the wave form of FIG. 2(*b*) of an output pulse obtained at the output terminal b of the first FF circuit 1 shows that the wave form of an output pulse *b* produced from the output terminal *b* of the first FF circuit 1 has such a relationship with a pulse having the basic frequency $f$ that said output pulse *b* has its polarity reversed for every two of the latter pulses having the basic frequency.

Therefore, it is seen from the above fact that if a pulse having the basic frequency $f$ is supplied to the counter circuit after having its polarity reversed to the wave form of FIG. 2(*b*) by a proper device, then it will be possible directly to attain a 2/5 frequency division without using a pulse having a frequency twice the basic frequency $f$. This invention has been accomplished with notice paid to the abovementioned possibility.

Figure 3:
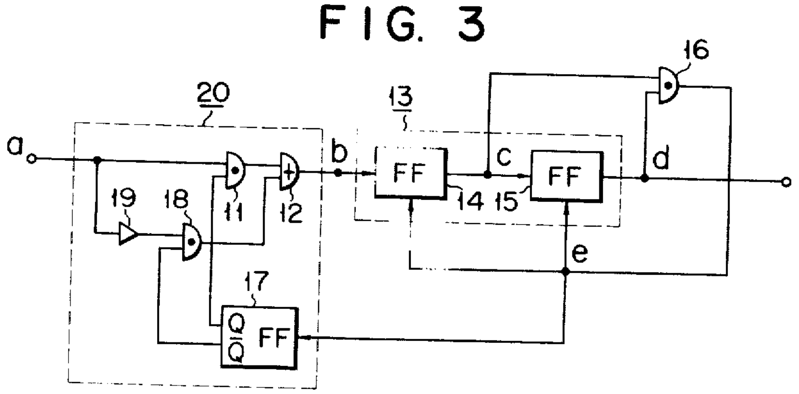
FIG. 3 is a block circuit diagram of the process of this invention of dividing frequency in the ratio or fraction whose numerator is 2 and whose denominator is an odd number, more particularly in the ratio or fraction whose numerator is 2 and whose denominator is 5.

There will now be described with reference to the associated drawing, for example, FIG. 3 the circuit arrangement of this invention for carrying out frequency division in the ratio or fraction whose numerator is 2 and whose denominator is an odd number. FIG. 3 is a block circuit diagram of an embodiment of this invention for effecting a 2/5 frequency division. The clock pulse input terminal a is connected to the input terminal b of the counter circuit 13 through a first AND circuit 11 and OR circuit 12 in turn. The counter circuit 13 is formed of first and second cascade connected FF circuits 14, 15 of, for example, the master-slave type. Obviously, these FF circuits 14, 15 may be of the ordinary type. The output terminals *c, d* of the first and second FF circuits 14, 15 are connected to the corresponding input terminals of an AND circuit 16 whose output terminal is connected to the reset terminals of the first and second FF circuits 14, 15 and also the input terminal of a third FF circuit 17. One output terminal Q of said third FF circuit 17 is connected to the other input terminal of the first AND circuit 11. The other output terminal Q of the FF circuit 17 is connected to one input terminal of a second AND circuit 18. An inverter 19 is disposed between the other input terminal of the second AND circuit 18 and the clock pulse input terminal *a*. The third FF circuit 17, first and second AND circuits 11, 18, OR circuit 12 and inverter 19 collectively constitute a device 20 for reversing the polarity of input clock pulses supplied to the input terminal a.

There will now be described with reference to the wave forms of FIG. 4 the operation of the circuit of FIG. 3. The wave forms shown in FIGS. 4(*a*), 4(*b*), 4(*c*), 4(*d*) and 4(*e*) represent output pulses generated at the various points *a, b, c, d, e* of FIG. 3.

Now let it be assumed that the third FF circuit 17 of the polarity-reversing devide 20 has an output from its Q terminal set at a level of 1 and an output from its Q terminal set at a level of 0. Where, under this condition, an input clock pulse having a frequency f and a wave form as shown in FIG. 4(*a*) is supplied to the clock pulse input terminal *a* of FIG. 3, then the input clock pulse, together with a 1 output from the third FF circuit 17, is transmitted to the first AND circuit 11 which in turn is enabled to supply said clock pulse. An output from said first AND circuit 11 is conducted to the counter circuit 13 formed, as previously described, of the first and second FF circuits 14, 15 through the OR circuit 12. Accordingly, the clock pulses 21*a*, 22*a*, 23*a* of FIG. 4(*a*) are supplied to the input terminal b of the counter circuit 13 in an intact state, namely, in the form of clock pulses indicated by 21*b*, 22*b*, 23*b* in FIG. 4(*b*). The clock pulses 21*b*, 22*b* have their frequencies divided into halves by the first FF circuit 14 of the counter circuit 13, producing an output pulse 24*c* as shown in FIG. 4(*c*) at the output terminal *c* of said first FF circuit 14. The output pulse 24*c* sets the second FF circuit 15 at its decaying causing a pulse 25*d* to rise at the output terminal d as shown in FIG. 4(*d*).

Figure 4:
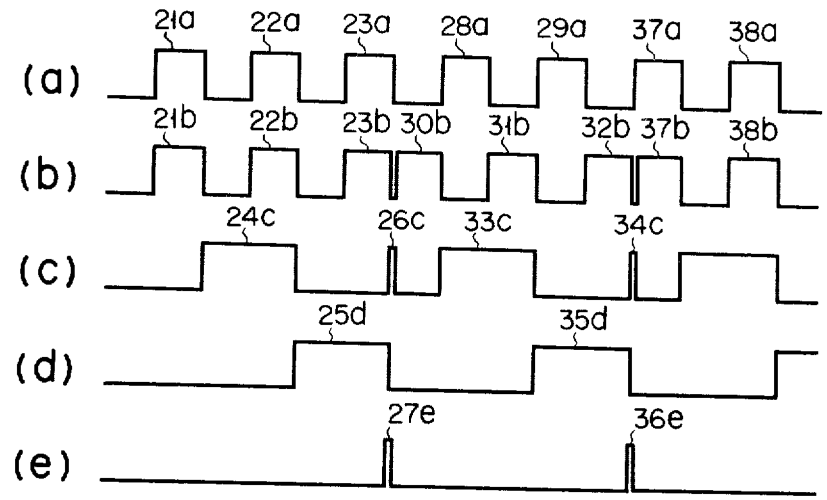
FIG. 4 illustrates the wave forms of signals appearing in the various sections of the block circuit diagram of FIG. 3.

Where, under this condition, the counter circuit 13 is supplied with a third clock pulse 23*b*, then an output from the first FF circuit 14 rises as shown by 26*c* of FIG. 4(*c*). Since both first and second FF circuits generate an output at the same time, a pulse having such a wave form as shown by 27*e* of FIG. 4(*e*) is delivered from the AND circuit 16. This output pulse 27*e* resets the first and second FF circuits 14, 15 of the counter circuit 13. Accordingly, outputs 26*c*, 25*d* from the first and second FF circuits 14, 25 immediately decay. At the same time, the reset pulse 27*e* delivered from the AND circuit 16 also decays.

The reset pulse 27*e* reverses at its decaying an output from the third FF circuit 17 of the polarity-reversing device 20, causing the Q terminal of said third FF circuit 17 manner produce a 0 output and the Q terminal thereof to give forth a 1 output. As the result, the first AND circuit 11 is disenabled and the second AND circuit 18 is enabled. Thus fourth and fifth clock pulses 28*a*, 29*a* are conducted through the second AND circuit 18 and OR circuit 12 to the input terminal *b* of the counter circuit 13 after having their polarity reversed by the inverter 19. Accordingly, the input terminal b of the counter circuit 13 is supplied with polarity-reversed clock pulses 30*b*, 31*b*, 32*b* as shown in FIG. 4(*b*). The counter circuit 13 counts the polarity-reversed clock pulses 30*b*, 31*b*, 32*b* supplied thereto, causing the output terminal *c* of the first FF circuit 14 to give forth pulses whose frequency has been divided into halves as shown by 33*c*, 34*c*of FIG. 4(*c*) and also causing the output terminal *d* of the second FF circuit 15 to produce a pulse as shown by 35*d* of FIG. 4(*d*) whose frequency has been derived by further halving the frequency of the former pulse indicated by 33*c*.

When the counter circuit 13 is supplied with the polarity-reversed clock pulse 32*b*, then the output terminals *c*, *d*, of the first and second FF circuits 14, 15 generate an output at the same time. As the result, the AND circuit 16 produces a second reset pulse 36*e* to reset the counter circuit 13, causing outputs from the first and second FF circuits 14, 15 to decay in synchronization with the reset pulse 36*e* as indicated by 34*c*, 35*d* of FIGS. 4(*c*) and 4(*d*). This reset pulse 36*e* is conducted to the third FF circuit 17 to reverse the polarity of outputs therefrom, causing its Q terminal to give forth a 1 output and its Q terminal to produce a 0 output. Thereafter, an input clock pulse is conducted to the counter circuit 13 through the first AND circuit 11, with the supply of a polarity-reversed clock pulse prevented by the second AND circuit 18. Accordingly, clock pulses delivered to the counter circuit 13 have their polarity brought back, as shown by 37*b*, 38*b*, to the same polarity of the clock pulses 37*a*, 38*a*, initially supplied to the input terminal *a*. Hereafter, the counting of input clock pulses and the reversion of their polarity are repeated in the same manner, as described above.

As apparent from FIG. 4 and the foregoing description, the output terminal of the counter circuit 13 produces two output pulses as shown in FIG. 4(*d*) for every five input clock pulses (FIG. 4(*a*)), namely, attaining a 2/5 frequency division.

There will now be described a second embodiment of this invention for attaining a 2/7 frequency division with reference to FIG. 5 showing its block circuit diagram. The circuit of FIG. 5 has substantially the same arrangement as that of FIG. 3, excepting that a clock pulse supplied to the input terminal b of the counter circuit 13 is used as an input signal to the AND circuit 16 for generating a reset signal. The parts of FIG. 5 the same as those of FIG. 3 are denoted by the same numerals description thereof being omitted.

There will now be described with reference to the wave forms in FIGS. 6(*a*) to 6(*e*) the operation of the second embodiment of FIG. 5. When the input terminal b of the first FF circuit 14 is supplied with a fourth clock pulse 42*b*, having the same polarity as a clock pulse 41*a* delivered to the input terminal a, then the AND circuit 16 is simultaneously supplied with output pulses 42*b*, 43*c*, 44*d* from the input terminal *b* of the counter circuit 13, the output terminal *c* of the first FF circuit 14 and the output terminal *d* of the second FF circuit 15, then the AND circuit 16 is enabled to deliver a reset pulse 45*e* therefrom to the first and second FF circuits 14, 15. This reset pulse 45*e* reverses the polarity of a clock pulse supplied to the counter circuit 13 as shown in FIG. 6(*b*). When the counter circuit 13 counts a fourth polarity-reversed pulse, then the AND circuit 16 which is now supplied with three input signals at the same time gives forth a second reset pulse 46*e* to the first and second FF circuits 14, 15, causing an input clock pulse delivered to the input terminal *b* of the counter circuit 13 to have the same polarity as a clock pulse supplied to the input terminal *a*, thus bringing the frequency divider back to the initial condition. Comparison of the wave form of an input pulse shown in FIG. 6(*a*) and that of an output pulse shown in FIG. 6(*d*) indicates that two output pulses are generated for every seven input pulses, namely, attaining a 2/7 frequency division.

Further, it will be obviously possible to carry out a 2/3 frequency division if the counter circuit 13 consists of a singel FF circuit, and other forms of frequency division, for example, 2/9 or 2/13, if the counter circuit 13 has an increasing number of FF circuits and the timing of generating a reset pulse is properly selected, namely, enabling frequency to be divided always in the ratio or fraction whose numerator is 2 and whose denominator is an odd number.

The frequency divider of this invention can realize other forms of frequency division than the aforementioned ratio of frequency division, whose numerator is 2 and whose denominator is an odd number. For example, the ratio of 4/15 can be effected by multiplying together two fractions 2/3 and 2/5 representing the ratios of frequency division.

There will now be described with reference to FIGS. 7 and 8 the operation of a frequency divider according to a third embodiment of this invention. This third embodiment can carry out a 2/7 frequency division in the same manner as in the circuit of FIG. 5, excepting that frequency division is effected without suppling a reset signal to the counter circuit 13, and the third FF circuit 17 is supplied with the last output from the counter circuit 13. The parts of FIG. 7 the same as those of FIG. 5 are denoted by the same numerals, description therof being omitted.

There will now be detailed with reference to the wave forms of FIG. 8 the operation of the frequency dividing circuit according to the third embodiment of FIG. 7. Now let it be assumed that the Q terminal of the third FF circuit 17 is set at a level of 1 and the Q terminal thereof at a level of 0. Where, under this condition, the input terminal a is supplied with a clock pulse having a wave form shown in FIG. 8(*a*), then the input terminal of the counter circuit 13 is supplied through the AND circuit 11 and OR circuit 12 with clock pulses 51*b* to 54*b* having, as shown in FIG. 8(*b*), the same polarity as clock pulses 51*a* to 54*a* having the wave form shown in FIG. 8(*a*). The first and second FF circuits 14, 15 of the counter circuit 13 divide the frequency of input clock pulses in halves. Accordingly, the output terminal *c* of the first FF circuit 14 produces output pulses 55*c*, 56*c* having wave forms shown in FIG. 8(*c*) and the output terminal *d* of the second FF circuit 15 generates an output pulse 57*d* having a wave form shown in FIG. 8(*d*). Where, therefore, a clock pulse 57*d* shown in FIG. 8(*d*) decays at the output terminal *d* of the counter circuit 13, then outputs from the third FF circuit 17 have the polarity reversed, causing the Q terminal to generate a 0 output and the Q terminal to produce a 1 output. Thereafter, the input terminal *b* of the counter circuit 13 is supplied with polarity-reversed clock pulses 58*b* to 61*b* through the inverter 19, AND circuit 18 OR circuit 12.

Since the input clock pulses 58*b* to 61*b* similarly have their frequencies divided in halves by the first and second FF circuits 14, 15 of the counter circuit 13, the output terminal *c* of the first FF circuit 14 gives forth output pulses 62*c*, 63*c* having wave forms shown in FIG. 8(*c*) and the output terminal *d* of the second FF circuit 15 produces an output pulse 64*d* having a wave form shown in FIG. 8(*d*). At the decay of the output pulse 64*d*, outputs from the third FF circuit 17 have the polarity reversed, bringing the frequceny divider back to its original conditions, namely, causing the Q terminal of said third FF circuit 17 to give forth a 1 output and the Q terminal to produce a 0 output. Where the counter circuit 13 counts four input clock pulses supplied to the input terminal *b*, then said circuit 13 sends forth one clock pulse having a wave form shown in FIG. 8(*d*) to reverse the polarity of outputs from the third FF circuit 17. The operations of the first and second AND circuits 11, 18 are switched over to each other according to the manner in which outpus from the third FF circuit 17 have the polarity reversed. Comparison of the wave forms of FIG. 8(*a*) with those of FIG. 8(*d*) shows that two outputs clock pulses are generated for every seven input clock pulses, thereby attaining a 2/7 frequency division.

The frequency dividing circuit according to the third embodiment of FIG. 7 wherein the counter circuit 13 is not supplied with a reset signal presents difficulties in carrying out all forms of frequency division, and is only applicable in realizing a particular ratio of frequency division of $2/(2^{n+1} - 1)$ (where $n$ is an integer). In the case of FIG. 7, $n$ is chosen to be an integer 2.

FIGS. 9A, 9B, 9C, 9D are block circuit diagrams of the modifications of the polarity-reversing device 20 used in the embodiments of FIGS. 3, 5 and 7. The AND circuit and OR circuit jointly constituting a logic circuit are replaced by a NAND circuit in the modification of FIG. 9A and by a NOR circuit in that of FIG. 9B. In FIG. 9C, the AND circuit included in the logic circuit used in embodiments of FIGS. 3, 5 and 7 is replaced by a NAND circuit and the OR circuit of said embodiments is replaced by an AND circuit. In FIG. 9D, the AND circuit included in the logic circuit used in the above-mentioned embodiments is replaced by a NOR circuit. These modified arrangements can be easily provided by those skilled in the art. Throughout FIGS. 9A to 9D, the corresponding parts are denoted by the same numeral or those marked with a single prime, and description thereof is omitted.

FIGS. 10A, 10B, 10C are block circuits diagrams of the modifications of the system for resetting the counter circuit 13 used in the first embodiment of FIG. 3. In FIG. 10A, the AND circuit 16 is replaced by a NOR circuit 16', which displays the same function as the reset circuit of FIG. 3 by being supplied with outputs from the polarity-reversed output terminals Q of the first and second FF circuits 14, 15.

An FF circuit is generally divided into two types, namely, the type which is reset by a binary signal of 1 and the type which is reset by a binary signal of 0. The foregoing description refers to the embodiments wherein the FF circuit was reset by a binary signal of 1. It is obviously possible to use an FF circuit capable of being reset by a binary signal of 0. In this case, resetting can be effected by a NAND circuit or OR circuit shown in FIG. 10B or 10C. In all the cases of FIGS. 10A, 10B, 10C, resetting can be attained in the same manner as in FIG. 3. The parts of these figures the same as those of FIG. 3 are denoted by the same numerals or those marked with a single prime, description thereof being omitted. Any of the resetting systems of FIGS. 10A, 10B, 10C is obviously applicable as a modification of FIG. 5, by supplying one more input clock pulse, namely, three input clock pulses to a circuit denoted by a numeral 16'.

What is claimed is:

1. A frequency divider which comprises a counter circuit formed of one or more cascade connected binary counter units and supplied with an input clock pulse; a reset pulse supply means connected to the counter circuit so as to clear the contents of the counter circuit when it counts a prescribed number of input clock pulses; a polarity reversing device connected to the reset pulse supply means so as to reverse the polarity of input clock pulses delivered to the counter circuit upon receipt of a reset pulse from said reset pulse supply means, thereby attaining frequency division in the ratio or fraction whose numerator is 2 and whose denominator is an odd number.

2. A frequency divider according to claim 1 wherein the polarity reversing device comprises a binary memory device connected to the reset pulse supply means so as to have the polarity of outputs from said memory device reversed when supplied with a reset pulse from the reset pulse generator; and a logic circuit for supplying a clock pulse having the same polarity as the input clock pulse to the counter circuit upon receipt of an output from the first output terminal of the binary memory device and also supplying the counter circuit with a clock pulse having a polarity reversed from the input clock pulse upon receipt of an output from the second output terminal of the binary memory device.

3. A frequency divider according to claim 1 wherein the binary counter unit or units constituting the counter circuit consist of flip-flop circuits.

4. A frequency divider according to claim 1 wherein the reset pulse generator is an AND circuit supplied with a clock pulse delivered from the input and output terminals of the binary counter unit or units.

5. A frequency divider according to claim 1 wherein the reset pulse supply means is a NOR circuit supplied with a clock pulse given forth from the input and output terminals of the binary counter unit or units.

6. A freqeuncy divider according to claim 1 wherein the reset pulse supply means is a NAND circuit supplied with a clock pulse produced from the input and output terminals of the binary counter unit or units.

7. A freqeuncy divider according to claim 1 wherein the reset pulse supply means is an OR circuit supplied with a clock pulse transmitted from the input and output terminals of the binary counter unit or units.

8. A frequency divider according to claim 2 wherein the binary memory device consists of flip-flop circuits.

9. A frequency divider according to claim 2 wherein the logic circuit comprises a first AND circuit for receiving a first outpt signal from the binary memory device and an input clock pulse and supplying the counter circuit with said clock pulse having the same polarity as said input clock pulse; a second AND circuit for receiving a second output signal from the binary memory device and a polarity reversed input clock pulse through an inverter and supplying the counter circuit with said clock pulses having the same polarity as said polarity reversed input clock pulse; and an OR circuit selectively supplied with an output signal from either of the first and second AND circuits.

10. A frequency divider according to claim 2 wherein the logic circuit comprises a first NAND circuit for receiving a first output signal from the binary memory device and an input clock pulse and supplying the counter circuit with said clock pulse having the same polarity as said input clock pulse; a second NAND circuit for receiving a second output signal from the binary memory device and a polarity reversed input clock pulse through an inverter and supplying the counter circuit with said clock pulse having the same polarity as said polarity reversed intput clock pulse; and a third NAND circuit selectively supplied with an output signal from either of the first and second NAND circuits.

11. A frequency divider according to claim 2 wherein the logic circuit comprises a first NOR circuit for reversing a first output signal from the binary memory device and an input clock pulse and supplying the counter circuit with said clock pulse having the same polarity as said input clock pulse; a second NOR circuit for receiving a second output signal from the binary memory device and a polarity reversed input clock pulse through an inverter and supplying the counter circuit with said clock pulse having the same polarity as said polarity reversed input clock pulse; and a third NOR circuit selectively supplied with an output signal from either of the first and second NOR circuits.

12. A frequency divider according to claim 2 wherein the logic circuit comprises a first NAND circuit for receiving a first output signal from the binary memory device and an input clock pulse and supplying the counter circuit with said clock pulse having the same polarity as said input clock pulse; a second NAND circuit for receiving a second output signal from the binary memory device and a polarity reversed input clock pulse through an inverter and supplying the counter circuit with said clock pulse having the same polarity as said polarity reversed input clock pulse; and an AND circuit selectively supplied with an output signal from either of the first and second NAND circuits.

13. A frequency divider according to claim 2 wherein the logic circuit comprises a first NOR circuit for receiving a first output signal from the binary memory device and an input clock pulse and supplying the counter circuit with said clock pulse having the same polarity as said input clock pulse; a second NOR circuit for receiving a second output signal from the binary memory device and a polarity reversed input clock pulse through an inverter and supplying the counter circuit with said clock pulse having the same polarity as said polarity reversed input clock pulse; and an OR circuit selectively supplied with an output from either of the first and second NOR circuits.

14. A freqeuncy divider which comprises a counter circuit consisting or one or more cascade binary counter units and supplied with an input clock pulse; a device for receiving an output clock pulse from the counter circuit and reversing the polarity of said input clock pulse.

15. A frequency divider according to claim 14 wherein the polarity reversing device comprises a binary memory device carrying out polarity reversion upon receipt of an output signal from the last stage binary counter unit; and a logic circuit for receiving an output signal from the first output terminal of said binary memory device and supplying a clock pulse having the same polarity as the input clock pulse to the counter circuit and also for receiving an output signal from the second output terminal of said binary memory device and supplying the counter circuit with a clock pulse having an opposite polarity to said clock pulse.

16. A frequency divider according to claim 14 wherein the binary counter unit or units constituting the counter circuit are flip-flop circuits.

17. A frequency divider according to claim 15 wherein the binary memory device is a flip-flop circuit.

18. A frequency divider according to claim 15 wherein the logic circuit comprises a first AND circuit for receiving a first output signal from the binary memory device and an input clock pulse and supplying the counter circuit with a clock pulse having the same polarity as said input clock pulse; a second AND circuit for receiving a second output signal from the binary memory device and a polarity reversed input clock pulse through an inverter and supplying the counter circuit with a clock pulse having the same polarity as said polarity reversed input clock pulse; and an OR circuit selectively supplied with an output from either of the first and second AND circuits.

19. A frequency divider according to claim 15 wherein the logic circuit comprises a first NAND circuit for receiving a first output signal from the binary memory device and an input clock pulse and supplying the counter circuit with a clock pulse having the same polarity as said input clock pulse; a second NAND circuit for receiving a second output signal from the binary memory device and a polarity reversed input clock pulse through inverter and supplying the counter circuit with a clock pulse having the same polarity as said polarity reversed input clock pulse; and a third NAND circuit selectively supplied with an output from either of the first and second NAND circuits.

20. A frequency divider according to claim 15 wherein the logic circuit comprises a first NOR circuit for receiving a first output signal from the binary memory device and an input clock pulse and supplying the counter circuit with a clock pulse having the same polarity as said input clock pulse; a second NOR circuit for receiving a second output signal from the binary memory device and a polarity reversed input clock pulse through an inverter and supplying the counter circuit with a clock pulse having the same polarity as said polarity reversed input clock pulse; and a third NOR circuit selectively supplied with an output from either of the first and second NOR circuits.

21. A frequency divider according to claim 15 wherein the logic circuit comprises a first NAND circuit for receiving a first output signal from the binary memory device and an input clock pulse and supplying the counter circuit with a clock pulse having the same polarity as said input clock pulse; a second NAND circuit for receiving a second output signal from the binary memory device and a polarity reversed input clock pulse through an inverter and supplying the counter circuit with a clock pulse having the same polarity as said polarity reversed input clock pulse; and an AND circuit selectively supplied with an output from either of the first and second NAND circuits.

22. A frequency divider according to claim 15 wherein the logic circuit comprises a first NOR circuit for receiving a first output signal from the binary memory device and an input clock pulse and supplying the counter circuit with a clock pulse having the same polarity as said input clock pulse; a second NOR circuit for receiving a second output signal from the binary memory device and a polarity reversed input clock pulse through an inverter and supplying the counter circuit with a clock pulse having the same polarity as said polarity reversed input clock pulse; and an OR circuit selectively supplied with an output from either of the first and second NOR circuits.

* * * * *

UNITED STATES PATENT AND TRADEMARK OFFICE

CERTIFICATE OF CORRECTION

PATENT NO. : 3,896,387

DATED : July 22, 1975

INVENTOR(S) : Naoyuki Kokado

It is certified that error appears in the above-identified patent and that said Letters Patent are hereby corrected as shown below:

COLUMN 4

Line 48, change "Q" to --$\overline{Q}$--;

Line 63, change "devide" to --device--;

Line 64, change "1" to --"1"--;

Line 64, change "Q" to --$\overline{Q}$--;

Line 65, change "0" to --"0"--.

COLUMN 5

Line 2, change "1" to --"1"--;

Line 28, change "25" to --15--;

Line 34, change "manner" to --to--;

Line 34, change "0" to --"0"--;

Line 34, change "Q" to --$\overline{Q}$--;

Line 35, change "1" to --"1"--;

Line 64, change "1" to --"1"--;

Line 64, change "Q" to --$\overline{Q}$--;

Line 64, change "0" to --"0"--.

UNITED STATES PATENT AND TRADEMARK OFFICE
CERTIFICATE OF CORRECTION

PATENT NO. : 3,896,387

DATED : July 22, 1975

INVENTOR(S) : Naoyuki Kokado

It is certified that error appears in the above-identified patent and that said Letters Patent are hereby corrected as shown below:

COLUMN 6

Line 25, add --shown-- between the words forms - in;

Line 54, change "singel" to --single--;

Line 62, change "aforementioned" to --aforesaid--;

COLUMN 7

Line 16, change "1" to --"1"--;

Line 16, change "Q" to --$\overline{Q}$--;

Line 17, change "0" to --"0"--;

Line 35, change "0" to --"0"--;

Line 35, change "Q" to --$\overline{Q}$--;

Line 36, change "1" to --"1"--;

Line 40, delete the word "the";

Line 49, change "frequceny" to --frequency--;

Line 50, change "conditions" to --condition--;

Line 51, change "1" to --"1"--;

UNITED STATES PATENT AND TRADEMARK OFFICE

CERTIFICATE OF CORRECTION

PATENT NO. : 3,896,387

DATED : July 22, 1975

INVENTOR(S) : Naoyuki Kokado

It is certified that error appears in the above-identified patent and that said Letters Patent are hereby corrected as shown below:

COLUMN 7

Line 52, change "Q" to --$\overline{Q}$--;

Line 52, change "0" to --"0"--;

Line 59, change "outpus" to --outputs--;

Line 62, change "outputs" to --output--;

COLUMN 8

Line 20, change "numeral" to --numerals--;

Line 22, change "circuits" to --circuit--;

Line 28, change "Q" to --$\overline{Q}$--;

Line 31, change "1" to --"1"--;

Line 32, change "0" to --"0"--;

Line 35, change "1" to --"1"--;

Line 36, change "0" to --"0"--;

COLUMN 9

Line 19, change "freqeuncy" to --frequency--;

UNITED STATES PATENT AND TRADEMARK OFFICE

CERTIFICATE OF CORRECTION

PATENT NO. : 3,896,387

DATED : July 22, 1975

INVENTOR(S) : Naoyuki Kokado

It is certified that error appears in the above–identified patent and that said Letters Patent are hereby corrected as shown below:

COLUMN 9

Line 23, change "freqeuncy" to --frequency--;

Line 31, change "outpt" to --output--;

Line 52, change "intput" to --input--;

Line 57, change "versing" to --ceiving--;

COLUMN 10

Line 27, change "freqeuncy" to --frequency--;

Line 28, between the words cascade - binary, insert the word --connected--;

Line 44, between the words said - clock, insert the word --input--.

Signed and Sealed this

*twenty-fourth* Day of *February 1976*

[SEAL]

*Attest:*

RUTH C. MASON
*Attesting Officer*

C. MARSHALL DANN
*Commissioner of Patents and Trademarks*